United States Patent
Wheless, Jr. et al.

(10) Patent No.: US 7,800,205 B2
(45) Date of Patent: Sep. 21, 2010

(54) QUAD FLAT PACK (QFP) PACKAGE AND FLEXIBLE POWER DISTRIBUTION METHOD THEREFOR

(75) Inventors: Thomas O. Wheless, Jr., Eagle, ID (US); Randall Don Briggs, Boise, ID (US); Michael D. Cusack, Boise, ID (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1119 days.

(21) Appl. No.: 11/216,105

(22) Filed: Sep. 1, 2005

(65) Prior Publication Data

US 2007/0045809 A1   Mar. 1, 2007

(51) Int. Cl.
*H01L 23/495* (2006.01)
(52) U.S. Cl. ............ 257/666; 257/676; 257/E33.06; 257/E23.031; 438/123
(58) Field of Classification Search ............... 257/761, 257/730, 666
See application file for complete search history.

(56) References Cited

U.S. PATENT DOCUMENTS

| | | | | | |
|---|---|---|---|---|---|
| 5,084,753 | A | * | 1/1992 | Goida et al. | 257/685 |
| 5,715,147 | A | * | 2/1998 | Nagano | 361/813 |
| 5,731,970 | A | * | 3/1998 | Mori et al. | 363/132 |
| 6,034,423 | A | * | 3/2000 | Mostafazadeh et al. | 257/691 |
| 6,483,189 | B1 | * | 11/2002 | Fukunaga | 257/730 |
| 6,521,992 | B2 | * | 2/2003 | Kono | 257/723 |
| 6,680,219 | B2 | * | 1/2004 | Reyes et al. | 438/109 |
| 7,008,825 | B1 | * | 3/2006 | Bancod et al. | 438/123 |

* cited by examiner

*Primary Examiner*—Thao X Le
*Assistant Examiner*—Ajay K Arora

(57) ABSTRACT

A Quad Flat Pack (QFP) package which includes first and second dies arranged in a side-by-side orientation, and a power supply bus which protrudes between adjacent sides of the first and second dies and which supplies power to the adjacent sides via connections to the adjacent sides.

15 Claims, 9 Drawing Sheets

QUAD FLAT PACK (QFP) PACKAGE AND FLEXIBLE POWER DISTRIBUTION METHOD THEREFOR

BACKGROUND OF THE INVENTION

Description of the Related Art

System-in-Package (SIP) refers to an integrated circuit package which includes multiple dies, to thereby capture an entire functionality of a system within the single package. System-in-Package (SIP) is becoming more common and more valuable for small apparatuses such as cellular phones and Personal Digital Assistant (PDA) devices. Most System-in-Package (SIP) products are implemented using Ball Grid Array (BGA) packages. A BGA package includes a substrate that provides a mechanism for routing signals and power supply connections from the dies to solder balls of the BGA package.

QFP packages are also used in SIP products. However, a QFP package does not include a substrate to conduct signal and supply routing within the QFP package. Therefore, fly-over bonding and stitch bonding methods are utilized to assist with signal and supply routing within the QFP package. When dies positioned in the QFP package are arranged in a side-by-side orientation, it is difficult to supply power to adjacent sides (i.e., internally facing edges) of the dies from the package fingers (i.e., lead frames).

For example, FIG. 1 is a detailed diagram illustrating a conventional QFP package using the fly-over bonding method. As shown in FIG. 1, the QFP package 1 includes a first die 2 and a second die 4, Supply connections 5 on adjacent sides of the first die 2 and the second die 4 are wire-bonded up and over the first die 2 and the second die 4 to reach package fingers 6. As a result, it is difficult to manufacture the QFP package, and there is a high defect rate. Further, long connections 8 between the first die 2 and the second die 4 and the package fingers 6 are required when using the fly-over bonding method, which results in poor electrical performance.

Further, FIG. 2 is a detailed diagram illustrating a conventional QFP package using the stitch bonding method. As shown in FIG. 2, a wire 9 connects Supply connections 5 on the adjacent sides of the first die 2 and the second die 4 are wire bonded up and over the first die 2 and the second die 4 to outside supply connections 7, and then continue with the same wire to reach package fingers 6. Therefore, the stitch bonding method also requires long connections and sharing of the wire 9 by both adjacent supply connections 5 and the outside connections 6, which results in double current on a section 9a of the wire 9. The stitch bonding method also requires that an equivalent number of supply pads be present on the adjacent and outside edges of the first die 2 and the second die 4.

Thus, it is necessary to provide a QFP package and flexible power distribution method therefore capable of supplying power to adjacent sides of the dies in the QFP package using shorter connections which result in better electrical performance.

BRIEF DESCRIPTION OF THE DRAWINGS

These and other aspects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
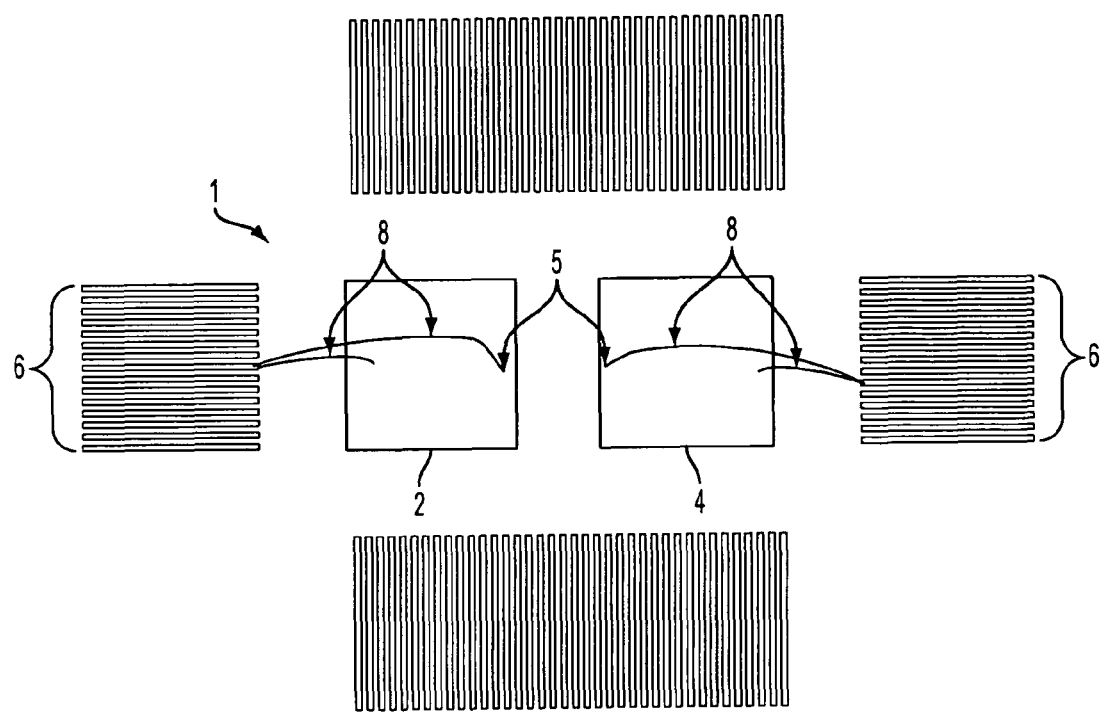
FIG. 1 is detailed diagram illustrating a conventional QFP package using a fly-over bonding method.
Figure 2:
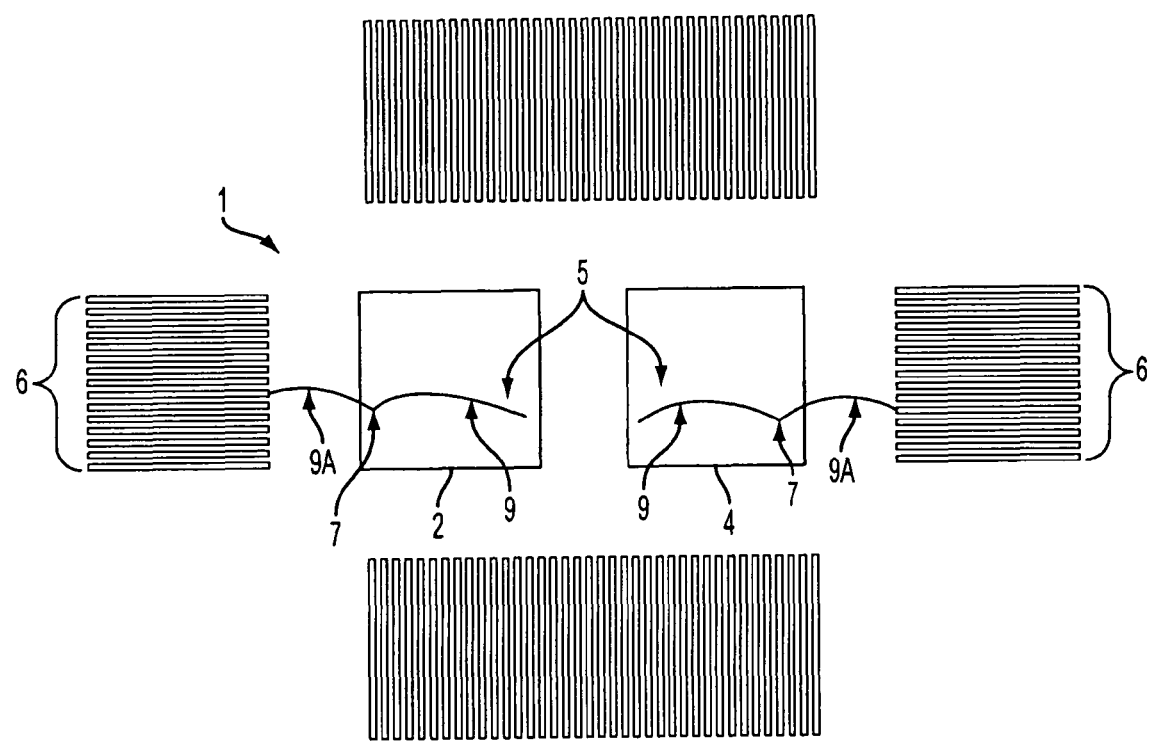
FIG. 2 is a detailed diagram illustrating a conventional QFP package using a stitch bonding method.

Reference will now be made in detail to the present preferred embodiments of the present invention, examples of which are illustrated in the accompanying drawings, wherein like reference numerals refer to like elements throughout.

Figure 3:
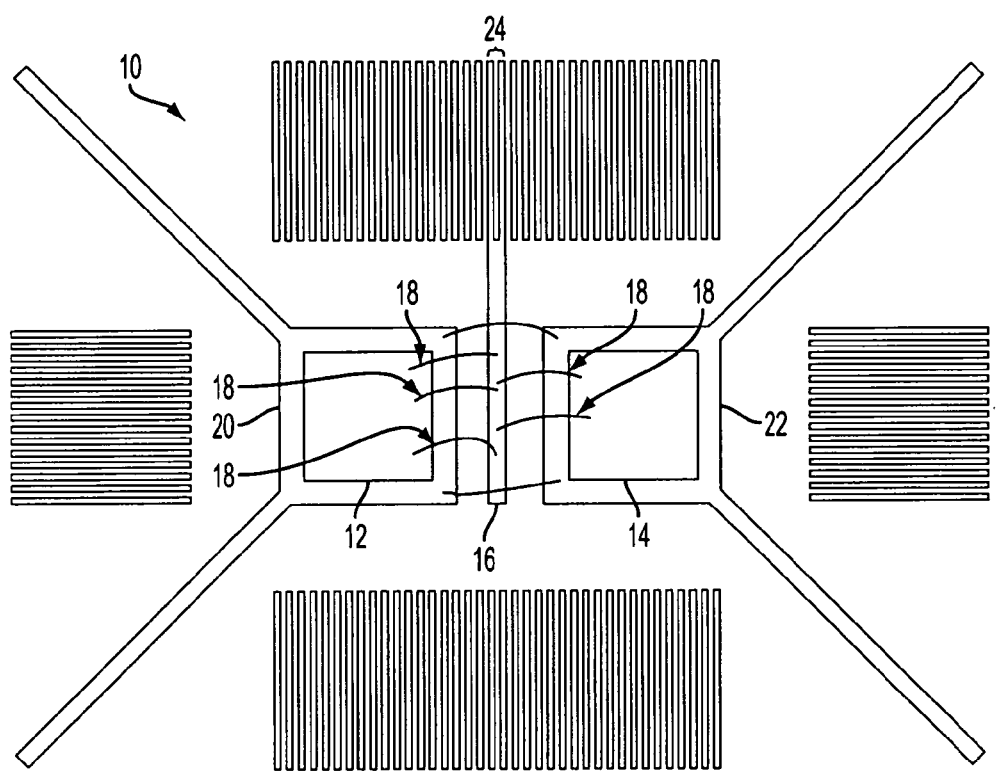
FIG. 3 is a detailed diagram illustrating QFP package according to an embodiment of the present invention.

FIG. 3 is a detailed diagram illustrating a QFP package according to an embodiment of the present invention. In FIG. 3, a QFP package 10 includes a first die 12 and a second die 14 arranged in a side-by-side orientation, and a power supply bus 16 which protrudes between adjacent sides of the first die 12 and the second die 14 and which supplies power to the adjacent sides via connections 18 to the adjacent sides.

The connections 18 are made, for example, by wire-bonding the adjacent sides of the first die 12 and the second die 14 to the power supply bus 16. However, the connections 18 are not limited to wire-bonding, and other manners of making a connection can be used. As a result of connecting the first die 12 and the second die 14 to the power supply bus 16 protruding between the first die 12 and the second die 14, a shorter connection is made as compared to the conventional fly-over bonding and stitch bonding. Therefore, the electrical performance and manufacturability of the QFP package in the present invention is better than that of the conventional QFP package.

The first die 12 and the second die 14 are positioned on a first die paddle 20 and a second die paddle 22, respectively, and the first die paddle 20 and the second die paddle 22 are connected with each other. For example, the first die paddle 20 and the second die paddle 22 may be connected with each other via an electrically-conductive adhesive material or by wire-bonding (as shown in FIG. 3). The connection of the first die paddle 20 and the second die paddle 22 are not limited hereto, and other manners of making the connection can be used.

The power supply bus 16 is of a 3.3 V power supply, for example. However, the power supply bus 16 is not limited to any particular voltage and may vary as necessary. Further, the power supply bus 16 includes a plurality of leads 24 integrally combined together. By combining the plurality of leads 24 to construct the power supply bus 16, the present invention does not require any additional manufacturing costs.

Figure 4:
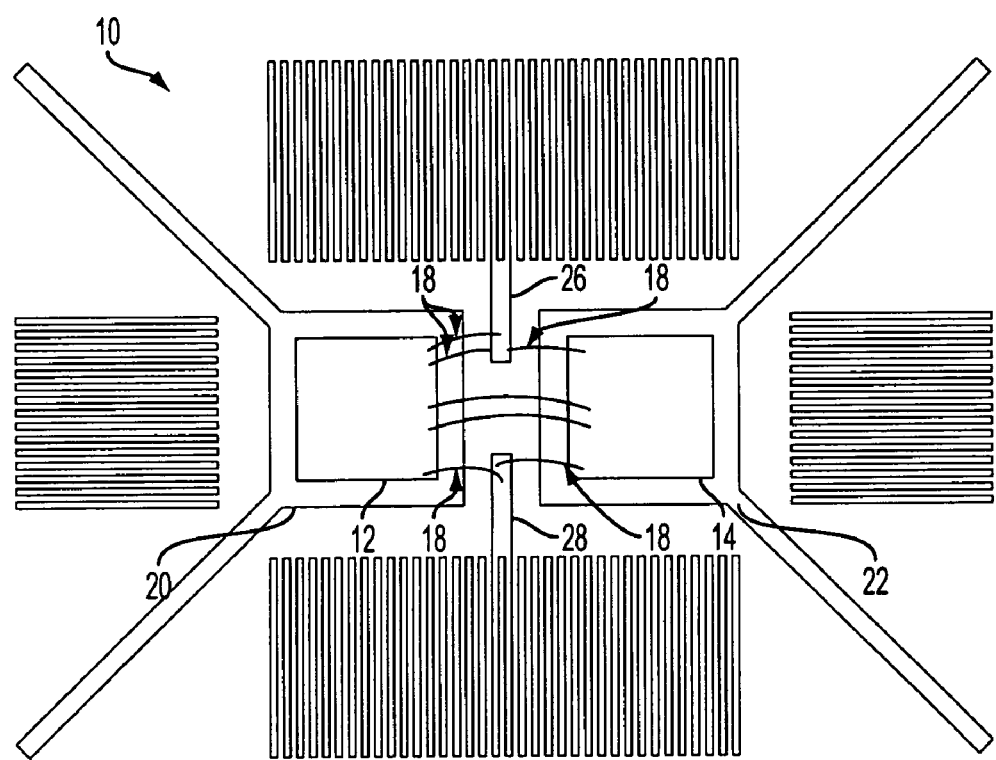
FIG. 4 is a detailed diagram illustrating a QFP package according to another embodiment of the present invention.

FIG. 4 is a detailed diagram illustrating a QFP package, according to another embodiment of the present invention. As shown in FIG. 4, as an alternative, the first die 12 and the second die 14 are positioned on the first die paddle 20 and the second die paddle 22, respectively, and the first die paddle 20 and the second die paddle 22 are integrally combined to form an H-shaped pattern. However, the first die paddle 20 and the second die paddle 22 are not limited to any particular shape or pattern.

The power supply bus 16 includes, for example, a first power supply bus 26 and a second power supply bus 28 which are positioned in series, for example, between the first die paddle 20 and the second die paddle 22. However, the present invention is not limited to any particular number of power supply buses.

Figure 5:
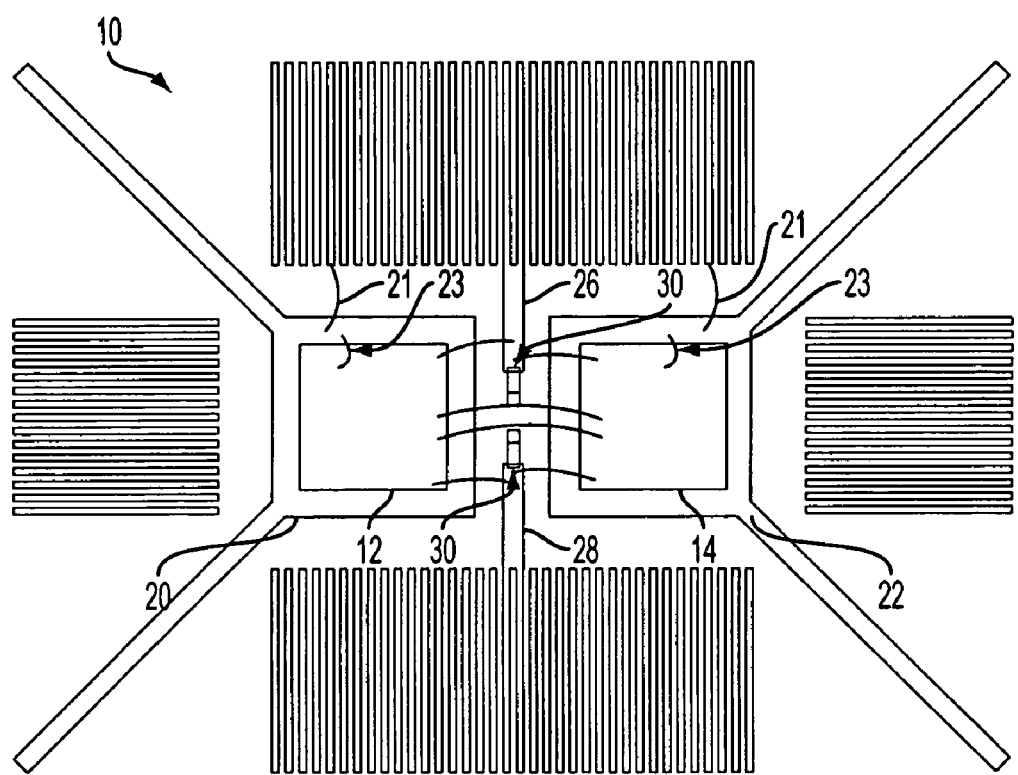
FIG. 5 is a detailed diagram illustrating a QFP package according to yet another embodiment of the present invention.

FIG. 5 is a detailed diagram illustrating a QFP package according to yet another embodiment of the present invention. As shown in FIG. 5, the first die paddle 20 and the second die paddle 22 may be connected to ground via bond wires 21. Furthermore, the ground pads of the first die 12 an the second die 14 may make a connection to ground by bonding to the first die paddle 20 and the second die paddle 22, respectively via wires 23. In addition, bypass caps 30 may be used to connect the first power supply bus 26 and the second power supply bus 28 to a center of the first die paddle 20 and the second die paddle 22, thus providing power supply bypassing within the QFP package 10.

Figure 6:
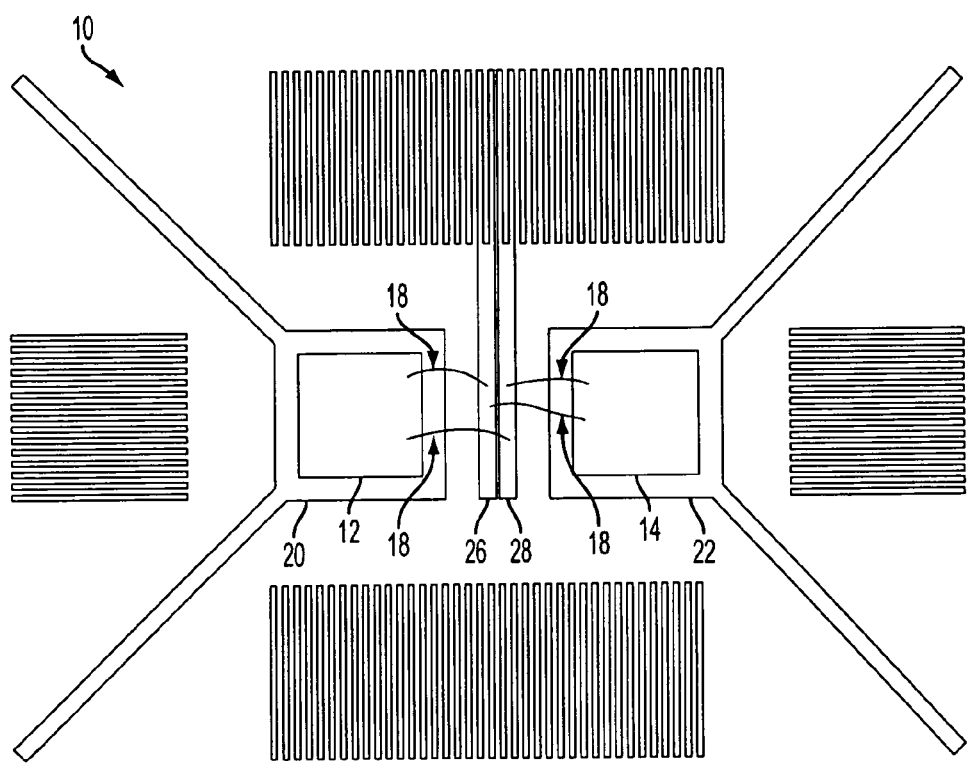
FIG. 6 is a detailed diagram illustrating a QFP package according to yet another embodiment of the present invention.

FIG. 6 is a detailed diagram illustrating a QFP package according to yet another embodiment of the present invention. In FIG. 6, the first die 12 and the second die 14 are arranged in a side-by-side orientation, and the first power supply bus 26 and the second power supply bus 28 are positioned in parallel in between the first die 12 and the second die 14, to supply power to adjacent sides of the first die 12 and the second die 14 via connections 18 to the adjacent sides. The first power supply bus 26 and the second power supply bus 28 each supply a different voltage. For example, the first power supply bus 26 provides a 3.3 V power supply and the second power supply bus 28 provides a 1.2 V power supply. However, the present invention is not limited to any particular voltage, and may vary as necessary. Further, the present invention is not limited to any particular number of power supply buses.

Figure 7:
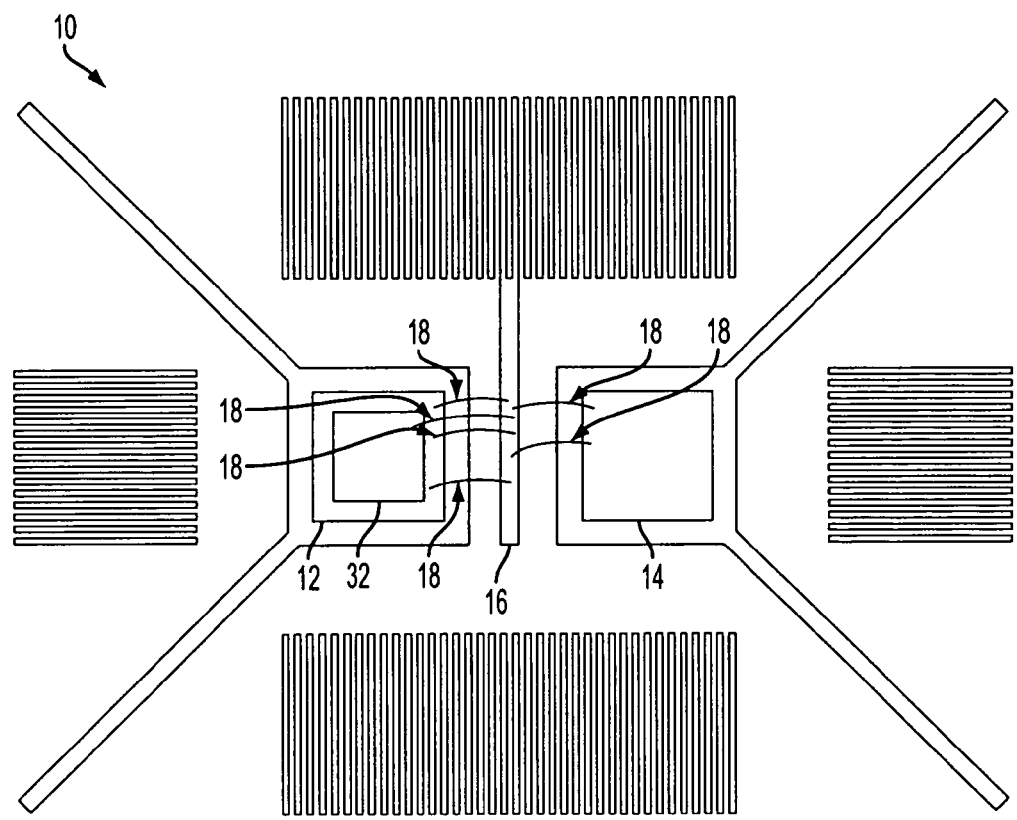
FIG. 7 is a detailed diagram illustrating a QFP package according to yet another embodiment of the present invention.

FIG. 7 is a detailed diagram illustrating a QFP package according to yet another embodiment of the present invention. In FIG. 7, QFP package 10 includes the first die 12 and the second die 14 arranged in a side-by-side orientation and a third die 32 stacked on top of one of the first die 12 and the second die 14, and power supply bus 16 positioned between the first die 12 and the second die 14 supplies power to each of the first die 12, the second die 14 and the third die 32. Therefore, it is possible to supply power to multiple dies within the QFP package without a need for long connections between the supply connections of the dies and package fingers of the QFP package. Although FIG. 7 illustrates only one additional die, the third die 32 stacked on top of the first die 12, the present invention is not limited to any particular number of dies stacked on top of the first die 12 and the second die 14, and may vary as necessary.

Figure 8:
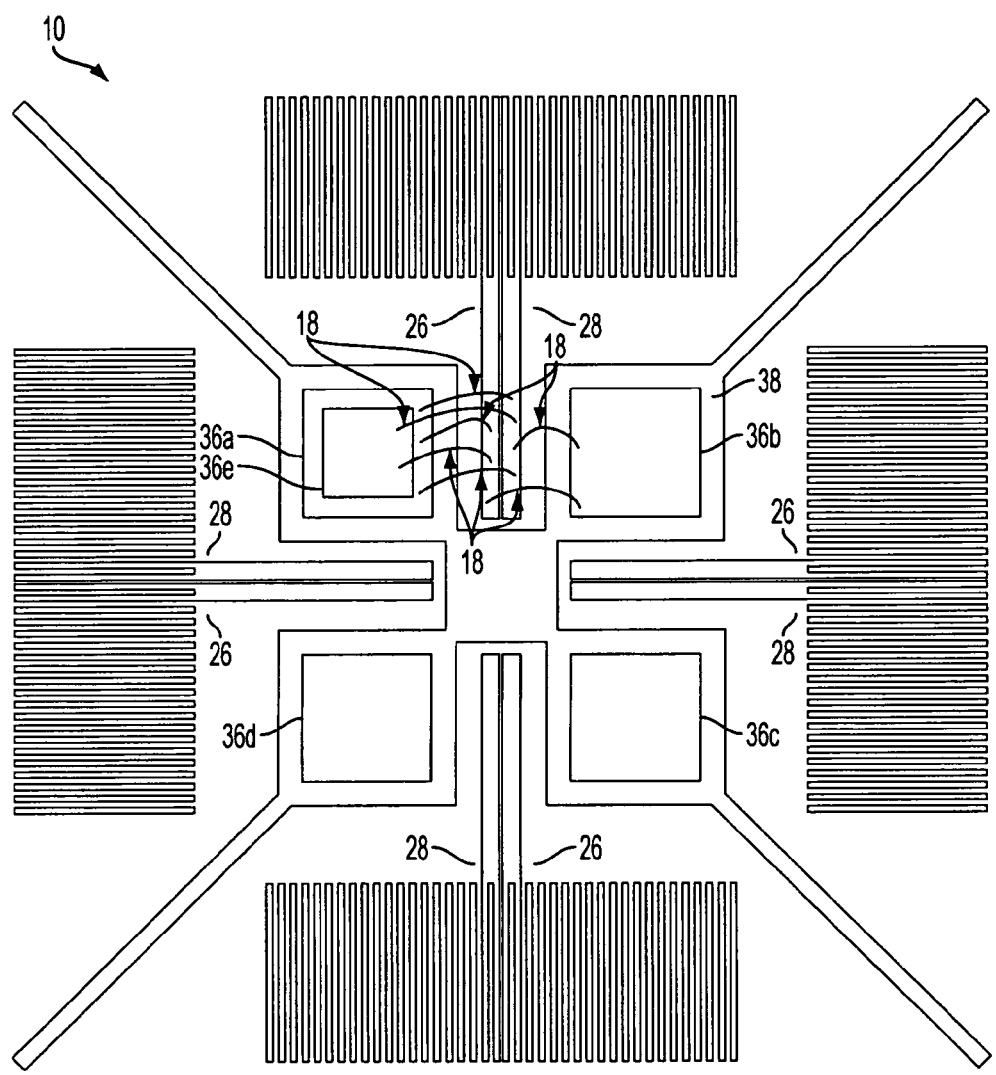
FIG. 8 is a detailed diagram illustrating a QFP package according to yet another embodiment of the present invention.

FIG. 8 is a detailed diagram illustrating a QFP package according to yet another embodiment of the present invention. In FIG. 8, the QFP package 10 includes a plurality of dies 36 arranged in a side-by-side orientation, and pairs of the first power supply bus 26 and the second power supply bus 28 positioned in parallel in between adjacent sides of the plurality of dies 36, to supply power to the adjacent sides via connections 18 to the adjacent sides. The present invention is not limited to any particular number of dies or power supply buses, and may vary as necessary.

As shown in FIG. 8, for example, the QFP package 10 further includes a die paddle 38 formed of a four-leaf-clover-shaped pattern, wherein the plurality of dies 36 includes four dies 36a, 36b, 36c and 36d, and each die is arranged on a portion of the pattern. The present invention is not limited to any particular number of die paddles or any particular shape or pattern of the die paddles, and may vary as necessary.

Further, in an embodiment of the present invention, in each pair of the first power supply bus 26 and the second power supply bus 28, each power supply bus can, for example, supply a different voltage.

In addition, the present invention may include a combination of both side-by-side and stacked die orientations. Therefore, additional dies may be stacked on top of the plurality of dies 36, as necessary. For example, as shown in FIG. 8, a fifth die 36e is stacked on top of die 36a.

Figure 9:
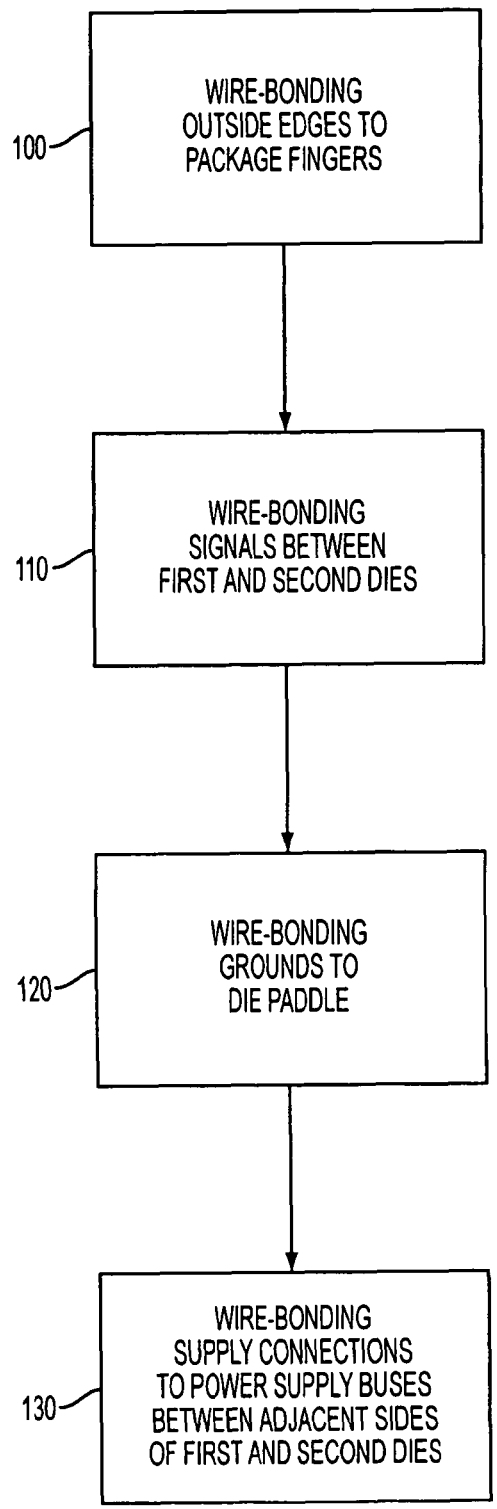
FIG. 9 is a flow chart illustrating a flexible power distribution method as applied to the QFP package according to the embodiment of the present invention shown in FIG. 3.

FIG. 9 is a flow chart illustrating a flexible power distribution method applied to the QFP package according to the embodiment of the present invention as shown in FIG. 3. Now referring to FIG. 9, at operation 100, on outside edges of the first and second dies, the signal and supply pad connections are wire-bonded directly to package fingers of the QFP package. From operation 100, the process moves to operation 110 where signal pads between the first and second dies are wire-bonded together (i.e., die-to-die). From operation 110 the process moves to operation 120, where grounds on the adjacent sides of the first and second dies are wire-bonded directly down to the die paddle, and the ground fingers of the lead frame are bonded to the die paddle. From operation 120, the process moves to operation 130, where supply connections on adjacent sides of the first and second dies are wire-bonded to the power supply buses that protrude between the adjacent sides of the first and second dies. This method is not limited to any being performed in any particular order, and may vary as necessary.

Additional aspects and advantages of the invention will be set forth in part in the description which follows, and, in part, will be apparent from the description, or may be learned by practice of the invention.

Aspects of the present invention are achieved by providing a QFP package including first and second dies arranged in a side-by-side orientation, and a power supply bus which protrudes between adjacent sides of the first and second dies and which supplies power to the adjacent sides via connections to the adjacent sides.

Aspects of the present invention are further achieved by providing a QFP package including first and second dies arranged in a side-by-side orientation, and first and second power supply buses positioned in parallel in between the first and second dies, to supply power to adjacent sides of the first and second dies via connections to the adjacent sides.

Aspects of the present invention are further achieved by providing a QFP package including first and second dies arranged in a side-by-side orientation, a third die stacked on top of one of the first and second dies, and a power supply bus positioned between the first and second dies supplying power to the first, second and third dies.

Aspects of the present invention are further achieved by providing a QFP package including a plurality of dies arranged in a side-by-side orientation, and pairs of power supply buses are positioned in parallel in between adjacent sides of the plurality of dies, to supply power to the adjacent sides via connections to the adjacent sides.

Aspects of the present invention are further achieved by providing a flexible power distribution method for a QFP package having first and second dies arranged in a side-by-side orientation and a power supply bus protruding between adjacent sides of the first and second dies, the method including connecting the adjacent sides of the first and second dies with the power supply bus to supply power to the adjacent sides.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A Quad Flat Pack (QFP) package comprising:
   first and second dies arranged in a side-by-side orientation, wherein each of the first and second dies has four sides;
   a first plurality of leads arranged along a first edge of the QFP package;
   a second plurality of leads arranged along a second edge of the QFP package;
   a first die paddle having four sides and a first extension finger that extends from a first corner of the first die paddle outwards in an orientation that angularly bisects a first gap that exists between the first and second plurality of leads;
   a third plurality of leads arranged along a third edge of the QFP package; and
   a power supply bus which forms a protrusion between adjacent sides of the first and second dies, the protrusion extending substantially the entire length of one of the four sides of each of the first and the second dies from the first edge towards the third edge with a proximal end of the power supply bus integrally connected to at least one lead amongst the first plurality of leads.

2. The QFP package of claim 1, wherein the power supply bus is configured to accommodate wire-bonding connections between a) the power supply bus and a first plurality of contacts located along the length of the one of the four sides of the first die and b) the power supply bus and a second plurality of contacts located along the length of the one of the four sides of the second die.

3. The QFP package of claim 1, wherein a gap is provided between a distal end of the power supply bus and the third plurality of leads.

4. The QFP package of claim 1,
   wherein the first die paddle further comprises a second extension finger that extends from a second corner of the first die paddle outwards in an orientation that angularly bisects a second gap that exists between the second and the third plurality of leads.

5. The QFP package of claim 4, further comprising:
   a fourth plurality of leads arranged along a fourth edge of the QFP package; and
   a second die paddle having four sides and a third extension finger that extends from a first corner of the second die paddle outwards in an orientation that angularly bisects a third gap that exists between the fourth and the first plurality of leads.

6. The QFP package of claim 5, wherein the second die paddle further comprises a fourth extension finger that extends from a second corner of the second die paddle outwards in an orientation that angularly bisects a fourth gap that exists between the fourth and the third plurality of leads.

7. A Quad Flat Pack (QFP) package comprising:
   first and second dies arranged in a side-by-side orientation, wherein each of the first and second dies has four sides;
   a first power supply bus oriented parallel to, and extending substantially the length of, one of the four sides of the first die;
   a second power supply bus oriented parallel to, and extending substantially the length of, one of the four sides of the second die, the second power supply bus arranged in parallel with the first power supply bus;
   third and fourth dies arranged in a side-by-side orientation, wherein each of the third and fourth dies has four sides;
   a third power supply bus extending substantially the length of one of the four sides of the third die;
   a fourth power supply bus extending substantially the length of one of the four sides of the fourth die, the fourth power supply bus arranged in parallel with the third power supply bus;
   a first die paddle on which is mounted the first die;
   a second die paddle on which is mounted the second die;
   a third die paddle on which is mounted the third die; and
   a fourth die paddle on which is mounted the fourth die, wherein the first, second, third, and fourth die paddles are interconnected with each other via a central four-sided area thereby forming a four-leaf-clover-shaped paddle configuration.

8. The QFP package of claim 7, wherein the first and second power supply buses extend in parallel between the first and the second dies, and the third and fourth power supply buses extend in parallel between the third and fourth dies.

9. The QFP package of claim 8, further comprising:
   a first plurality of leads arranged along a first edge of the QFP package; and
   a second plurality of leads arranged along a second opposing edge of the QFP package, and wherein the first power supply bus extends orthogonally from the first edge towards the second opposing edge with a proximal end of the first power supply bus connected to a first lead amongst the first plurality of leads for coupling a first power supply into the QFP package, and wherein the second power supply bus extends orthogonally from the first edge towards the second opposing edge with a proximal end of the second power supply bus connected to a second lead amongst the first plurality of leads for coupling a second power supply into the QFP package.

10. The QFP package of claim 9, wherein the first and the second power supply buses extend orthogonally from the first edge towards the second opposing edge in an arrangement that provides a gap between distal ends of the first and the second power supply buses and the second plurality of leads.

11. The QFP package of claim 7, wherein the first power supply bus is configured to accommodate wire-bonding connections between the first power supply bus and a first plurality of contacts located along the length of the one of the four sides of the first die.

12. The QFP package of claim 11, wherein the second power supply bus is configured to accommodate wire-bonding connections between the second power supply bus and a first plurality of contacts located along the length of the one of the four sides of the second die.

13. The QFP package of claim 12, wherein the first power supply bus is configured to accommodate wire-bonding connections between the first power supply bus and a second plurality of contacts located along the length of the one of the four sides of the second die.

14. The QFP package of claim 13, wherein the second power supply bus is configured to accommodate wire-bonding connections between the second power supply bus and a second plurality of contacts located along the length of the one of the four sides of the first die.

15. The QFP package of claim 7, wherein the first and second power supply buses are oriented orthogonal to the third and fourth power supply buses.

* * * * *